(12) United States Patent
Mou et al.

(10) Patent No.: US 11,530,696 B2
(45) Date of Patent: Dec. 20, 2022

(54) PIEZOELECTRIC MOTOR HAVING A MAIN BODY STRUCTURED AS A POLYGONAL PRISM

(71) Applicant: Microjet Technology Co., Ltd., Hsinchu (TW)

(72) Inventors: Hao-Jan Mou, Hsinchu (TW); Yung-Lung Han, Hsinchu (TW); Chi-Feng Huang, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 349 days.

(21) Appl. No.: 15/860,903

(22) Filed: Jan. 3, 2018

(65) Prior Publication Data
US 2018/0202428 A1   Jul. 19, 2018

(30) Foreign Application Priority Data
Jan. 13, 2017   (TW) .................. 106101185

(51) Int. Cl.
*F04B 45/047* (2006.01)
*H01L 41/09* (2006.01)
(Continued)

(52) U.S. Cl.
CPC ............ *F04B 45/047* (2013.01); *F04B 41/06* (2013.01); *F04B 43/0009* (2013.01);
(Continued)

(58) Field of Classification Search
CPC ...... F04B 43/046; F04B 45/047; F04B 35/04; F04B 39/121; F04B 41/06; F04B 43/0009; F04B 43/043; F04B 45/10
See application file for complete search history.

(56) References Cited

U.S. PATENT DOCUMENTS

| | | | |
|---|---|---|---|
| 4,738,493 A * | 4/1988 | Inagaki | ............... B60T 8/4031 |
| | | | 303/113.1 |
| 5,655,357 A * | 8/1997 | Kristen | ................ B65B 31/04 |
| | | | 53/512 |

(Continued)

FOREIGN PATENT DOCUMENTS

| CN | 205714691 U | 11/2016 |
|---|---|---|
| CN | 205744376 U | 11/2016 |

(Continued)

OTHER PUBLICATIONS

JP2015123012translate; Machine translation of JP 2015123012, Espacenet, Mar. 12, 2020, 2020.*

(Continued)

*Primary Examiner* — Nathan C Zollinger
*Assistant Examiner* — Timothy P Solak
(74) *Attorney, Agent, or Firm* — Birch, Stewart, Kolasch & Birch, LLP

(57) ABSTRACT

An air motor is provided for converting electrical energy into kinetic energy, and using the kinetic energy to generate a specified air pressure and a specified airflow rate. The air motor comprises plural air motor units, each of which includes a main body and a piezoelectric actuator. The piezoelectric actuator is disposed within the main body. When the piezoelectric actuator is enabled, the air within the main body is controlled and driven to flow. The air motor can be used to replace various types of motors, compressors or engines.

15 Claims, 8 Drawing Sheets

(51) Int. Cl.
  *F04B 41/06*   (2006.01)
  *F04B 43/04*   (2006.01)
  *F04B 43/00*   (2006.01)
  *F04B 39/12*   (2006.01)
  *F04B 53/16*   (2006.01)
(52) U.S. Cl.
  CPC ............ *F04B 43/046* (2013.01); *H01L 41/09* (2013.01); *F04B 39/121* (2013.01); *F04B 43/043* (2013.01); *F04B 53/16* (2013.01)

(56) References Cited

U.S. PATENT DOCUMENTS

| | | | |
|---|---|---|---|
| 6,106,245 A | 8/2000 | Cabuz | |
| 6,179,586 B1 | 1/2001 | Herb et al. | |
| 2002/0149653 A1* | 10/2002 | Sasaki | B41J 2/14 347/70 |
| 2006/0088929 A1* | 4/2006 | Nakajima | B01L 3/50273 435/287.2 |
| 2009/0148320 A1* | 6/2009 | Lucas | F04B 43/046 417/481 |
| 2009/0232683 A1* | 9/2009 | Hirata | F04B 45/047 417/413.2 |
| 2010/0038998 A1* | 2/2010 | Onishi | B06B 1/0651 310/369 |
| 2011/0285249 A1* | 11/2011 | Ishii | B06B 1/0603 310/334 |
| 2012/0171062 A1* | 7/2012 | Kodama | F04B 45/047 417/413.2 |
| 2013/0320807 A1* | 12/2013 | Sakaguchi | H02N 2/188 310/339 |
| 2014/0377099 A1* | 12/2014 | Hsueh | F04B 49/22 417/413.2 |
| 2015/0060012 A1* | 3/2015 | Kamitani | F04B 43/046 165/59 |
| 2015/0071797 A1* | 3/2015 | Takeuchi | F04B 43/0027 417/413.2 |
| 2016/0076530 A1 | 3/2016 | Chen et al. | |

FOREIGN PATENT DOCUMENTS

| | | | |
|---|---|---|---|
| CN | 205779588 U | 12/2016 | |
| EP | 2930363 A1 | 10/2015 | |
| JP | 2303-509624 A | 8/2003 | |
| JP | 2015-123012 A | 7/2015 | |
| JP | 2015123012 | * 7/2015 | ............ B01J 19/00 |
| TW | 200632242 A | 9/2006 | |
| TW | 200924809 A | 6/2009 | |
| TW | 201226720 A1 | 7/2012 | |
| TW | M465471 U | 11/2013 | |
| TW | M490850 U | 12/2014 | |
| WO | WO 2011/145544 A1 | 11/2011 | |
| WO | WO 2016/009870 A1 | 1/2016 | |

OTHER PUBLICATIONS

Extended European Search Report for corresponding European Application No. 18150202.2, dated May 16, 2018.

* cited by examiner

PIEZOELECTRIC MOTOR HAVING A MAIN BODY STRUCTURED AS A POLYGONAL PRISM

FIELD OF THE INVENTION

The present invention relates to an air motor. More particularly, it relates to an air motor converting electrical energy into kinetic energy and using the kinetic energy to generate a specified air pressure and an air flow at a specified airflow rate. Plural air motors are capable being assembled to form a combination structure, the appearance and the output air flow of which can be customized to fit various requirements.

BACKGROUND OF THE INVENTION

With the advancement of science and technology, fluid transportation devices used in many sectors such as pharmaceutical industries, computer techniques, printing industries or energy industries are developed toward elaboration and miniaturization. The fluid transportation devices are important components that are used in for example micro pumps, micro atomizers, printheads or industrial printers. Therefore, it is important to provide an improved structure of the fluid transportation device.

For example, in the pharmaceutical industries, pneumatic devices or pneumatic machines use conventional pumps or pressure valves to transfer gases. However, due to the volume limitations of the pumps and the pressure valves, the pneumatic devices or the pneumatic machines are bulky in volume. In other words, the conventional pneumatic device fails to meet the miniaturization requirement, can't be installed in or cooperated with portable equipment, and is not portable.

In addition to the pharmaceutical industries, the conventional pumps, compressors, engines or other driving devices are also used in electronic industries, printing industries, energy industries or traditional industries. However, for providing the required kinetic energy, the conventional driving device usually has a large volume to accommodate the complicated driving core. Moreover, during operations of the driving device, annoying noise or pollutant (e.g., flying dust) is readily generated. That is, the conventional driving device is neither friendly nor comfortable to the user.

Therefore, there is a need of providing an air motor in order to overcome the drawbacks of the conventional driving device.

SUMMARY OF THE INVENTION

An object of the present invention provides an air motor. The air motor is applied to various instruments or devices in pharmaceutical industries, electronic industries, printing industries, energy industries or traditional industries. The air motor is capable of converting electrical energy into kinetic energy, and using the kinetic energy to generate a specified air pressure and an air flow at a specified airflow rate that can be utilized as mechanical energy. Moreover, the main body of the air motor comprises at least one unit structure, so that plural air motors are capable of being assembled to form a combination structure through connecting the unit structures thereof. The appearance, the volume and the total output air flow of the combination structure can be designed and customized according to the practical requirements that broad applicability is provided. Furthermore, each air motor of the combination structure uses a piezoelectric actuator to convert electrical energy, so that undesired noise generated by conventional motor is largely reduced.

In accordance with an aspect of the present invention, an air motor is provided. The air motor is provided for converting electrical energy into kinetic energy, and using the kinetic energy to generate a specified air pressure and an air flow at a specified airflow rate. The air motor includes a main body and a piezoelectric actuator, wherein the piezoelectric actuator is disposed within the main body. When the piezoelectric actuator is enabled, the air within the main body is driven to flow. The air motor can be used to replace various types of conventional motors, compressors or engines.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

The air motor of the present invention can be applied to various instruments or devices in pharmaceutical industries, electronic industries, printing industries, energy industries or traditional industries. The air motor of the present invention is capable of converting electrical energy into kinetic energy and using the kinetic energy to generate a specified air pressure and an air flow at a specified airflow rate, wherein the air pressure is in the range between 10 mmHg and 10000 mmHg, and the airflow rate is in the range between 0.1 liter/min and 1000 liter/min.

Figure 1A:
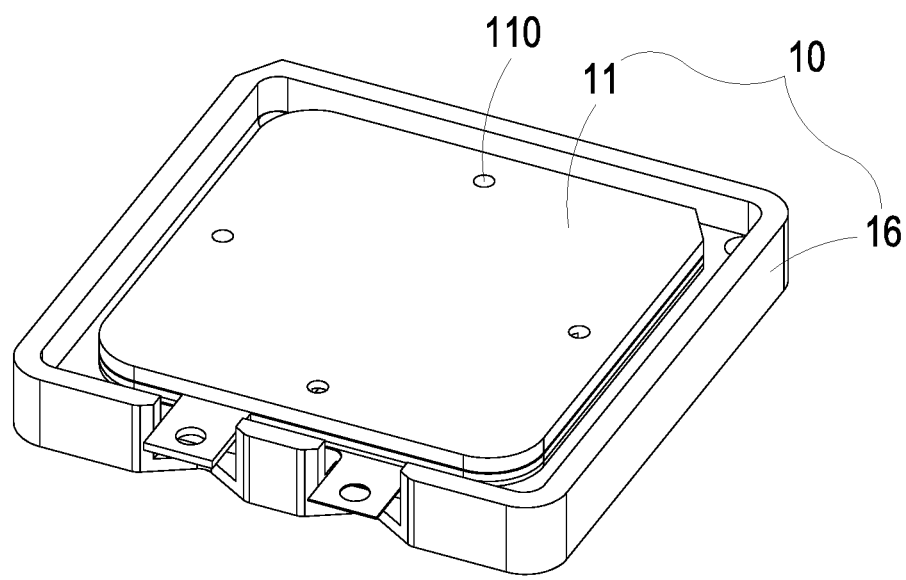
FIG. 1A is a schematic perspective view illustrating the structure of an air motor according to a first embodiment of the present invention.
Figure 1B:
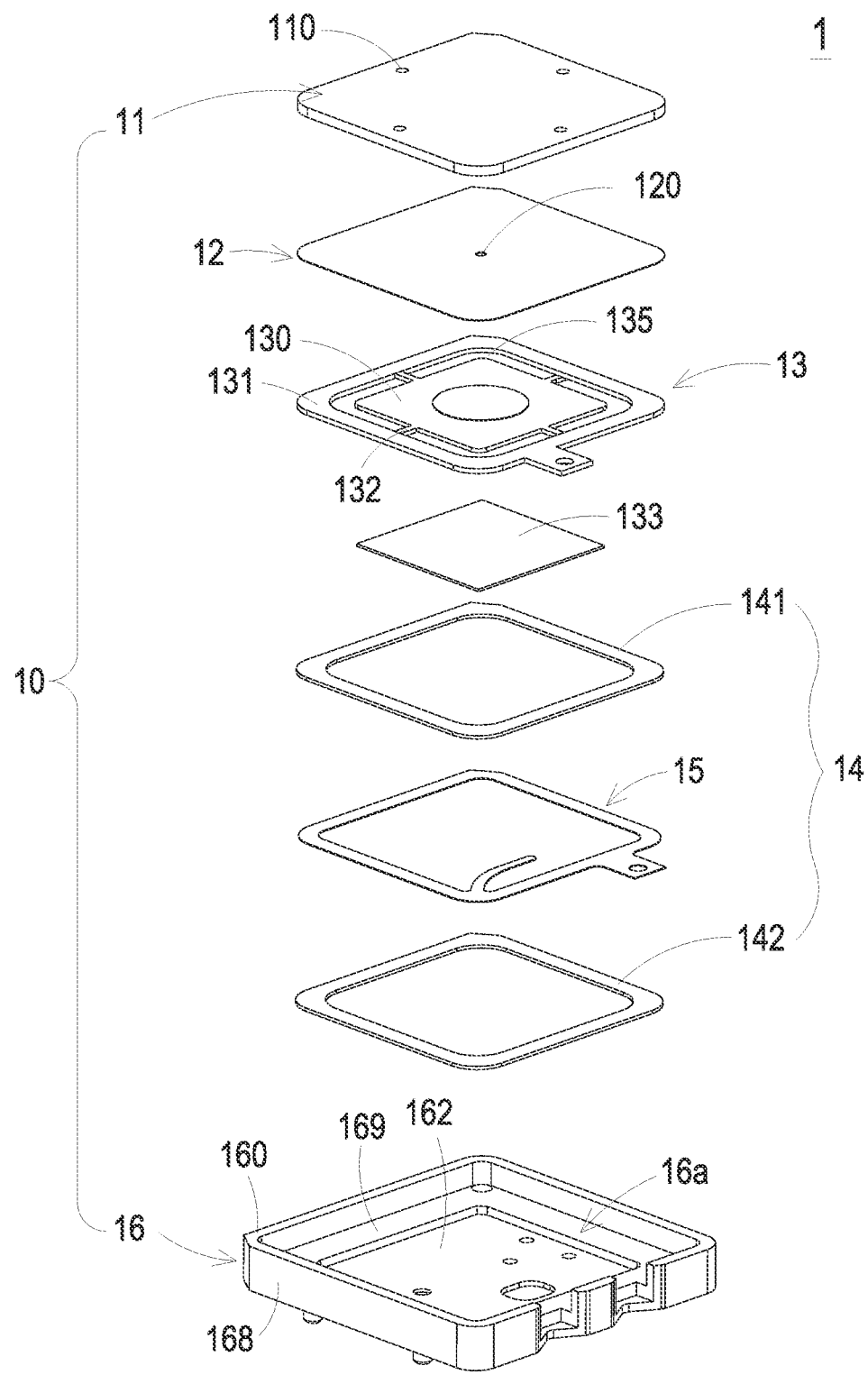
FIG. 1B is a schematic exploded view illustrating the air motor of FIG. 1A.

FIG. 1A is a schematic perspective view illustrating the structure of an air motor according to a first embodiment of the present invention. FIG. 1B is a schematic exploded view illustrating the air motor of FIG. 1A. The air motor 1 comprises a main body 10 and a piezoelectric actuator 13. The piezoelectric actuator 13 is disposed within the main body 10. When the piezoelectric actuator 13 is enabled, the air within the main body 10 is controlled and driven to flow, so as to produce the specified air pressure and an air flow at the specified airflow rate.

Please refer to FIGS. 1A and 1B. In this embodiment, the air motor 1 is a piezoelectric air pump for driving the air to flow, the main body 10 includes but not limited to a gas inlet plate 11 and a gas collecting plate 16, and the piezoelectric actuator 13 is disposed between the gas inlet plate 11 and the gas collecting plate 16. The assembled air motor 1 with a substantially square profile is shown in FIG. 1A. More specifically, the inner components of the air motor 1 further comprise a resonance plate 12, insulation plates 14 and a conducting plate 15. The gas inlet plate 11, the resonance plate 12, the piezoelectric actuator 13, the first insulation plate 141, the conducting plate 15, the second insulation plate 142 and the gas collecting plate 16 are stacked on each other sequentially to assemble the air motor 1. The piezoelectric actuator 13 comprises a suspension plate 130 and a piezoelectric plate 133. The gas collecting plate 16 comprises a bottom plate 169 and a sidewall 168 protruding from the edges of the bottom plate 169. An accommodation space 16a is defined by the bottom plate 169 and the sidewall 168 collaboratively, and the piezoelectric actuator 13 is disposed within the accommodation space 16a.

Please refer to FIG. 1B again. The gas inlet plate 11 comprises at least one inlet 110. In this embodiment, the gas inlet plate 11 has four inlets 110. In response to the atmospheric pressure, the air is introduced into the air motor 1 through the inlets 110. Preferably but not exclusively, the resonance plate 12 is made of a flexible material. The resonance plate 12 comprises a central aperture 120. The piezoelectric actuator 13 comprises the suspension plate 130, an outer frame 131, at least one bracket 132 and the piezoelectric plate 133. The at least one bracket 132 is connected between the suspension plate 130 and the outer frame 131. In this embodiment, the piezoelectric plate 133 has a square shape with a size slightly smaller than or equal to the suspension plate 130. That is, the length of a side of the piezoelectric plate 133 is not larger than the length of a side of the suspension plate 130. As so, when the piezoelectric plate 133 is aligned with and attached on the suspension plate 130, the piezoelectric plate 133 does not extend over the suspension plate 130. As shown in FIG. 1B, the insulation plates 14 comprises the first insulation plate 141 and the second insulation plate 142. The first insulation plate 141, the conducting plate 15 and the second insulation plate 142 are arranged between the piezoelectric actuator 13 and the gas collecting plate 16. The profiles of the first insulation plate 141, the conducting plate 15 and the second insulation plate 142 substantially match the profile of the outer frame 131 of the piezoelectric actuator 13. A surface 160 of the gas collecting plate 16 is concaved to define a gas-collecting chamber 162. The air that is introduced through the inlet 110 of the gas inlet plate 11 and transferred downwardly is temporarily accumulated in the gas-collecting chamber 162.

Figure 1C:
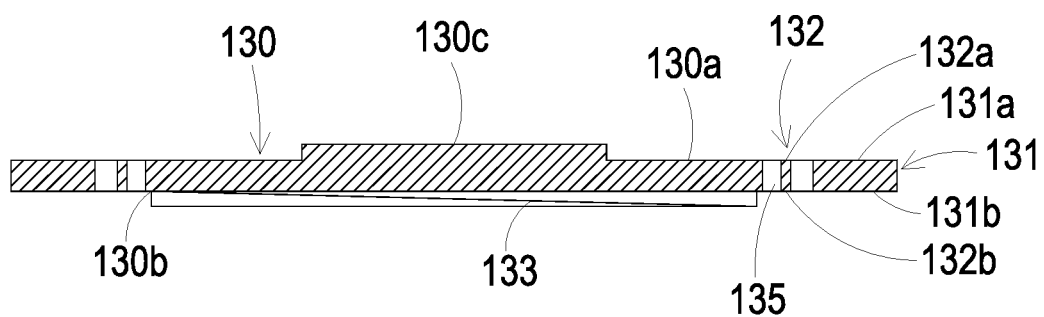
FIG. 1C is a schematic cross-sectional view illustrating the piezoelectric actuator of the air motor of FIG. 1B.

FIG. 1C is a schematic cross-sectional view illustrating the piezoelectric actuator of the air motor of FIG. 1B. As shown in FIGS. 1B and 1C, the piezoelectric actuator 13 comprises the suspension plate 130, the outer frame 131, the at least one bracket 132, and the piezoelectric plate 133. In this embodiment, the suspension plate 130 is a square plate with a stepped structure, having a first surface 130b and an opposing second surface 130a, while a bulge 130c is formed on the second surface 130a. The bulge 130c may be a circular convex structure. The piezoelectric plate 133 is attached on the first surface 130b of the suspension plate 130. In response to an applied voltage, the piezoelectric plate 133 would be subjected to a curvy vibration. The outer frame 131 is arranged around the suspension plate 130. It is noted that the number of the at least one bracket 132 may be varied according to the practical requirements. In this embodiment, there are four brackets 132 connected between the suspension plate 130 and the outer frame 131 so as to elastically support the suspension plate 130. Meanwhile, at least one vacant space 135 is formed between the bracket 132, the suspension plate 130 and the outer frame 131 for allowing the air to go through. In this embodiment, the suspension plate 130, the four brackets 132 and the outer frame 131 are integrally formed and produced by processing a metal plate (e.g., a stainless steel plate). That is, the piezoelectric actuator 13 is a combination of the piezoelectric plate 133 and the processed metal plate. Preferably but not exclusively, the piezoelectric plate 133 is a piezoelectric ceramic plate. In some other embodiments, the piezoelectric plate 133 is a stack of plural films, e.g. a stack of plural piezoelectric ceramic plates.

Please refer to FIG. 1C again. The first surface 130b of the suspension plate 130, a first surface 131b of the outer frame 131 and a first surface 132b of the bracket 132 are coplanar with each other. Similarly, the second surface 130a of the suspension plate 130, a second surface 131a of the outer frame 131 and a second surface 132a of the bracket 132 are coplanar with each other. In this embodiment, the suspension plate 130 is a square plate. The length of the suspension plate 130 is in the range between 0.1 nm and 1 m, and preferably in the range between 2 cm and 20 cm. The width of the suspension plate 130 is in the range between 0.1 nm and 1 m, and preferably in the range between 2 cm and 20 cm. The thickness of the suspension plate 130 is in the range between 0.1 nm and 1 m, and preferably in the range between 2 cm and 20 cm. The thickness of the outer frame 131 is substantially equal to the thickness of the suspension plate 130. The length of the piezoelectric plate 133 is equal to or shorter than the length of the suspension plate 130. More specifically, the length of the piezoelectric plate 133 is in the range between 0.1 nm and 1 m, and preferably in the range between 2 cm and 20 cm. The width of the piezoelectric plate 133 is in the range between 0.1 nm and 1 m, and preferably in the range between 2 cm and 20 cm. The thickness of the piezoelectric plate 133 is in the range between 0.1 nm and 50 mm, and preferably in the range between 1 mm and 20 mm.

Figure 1D:
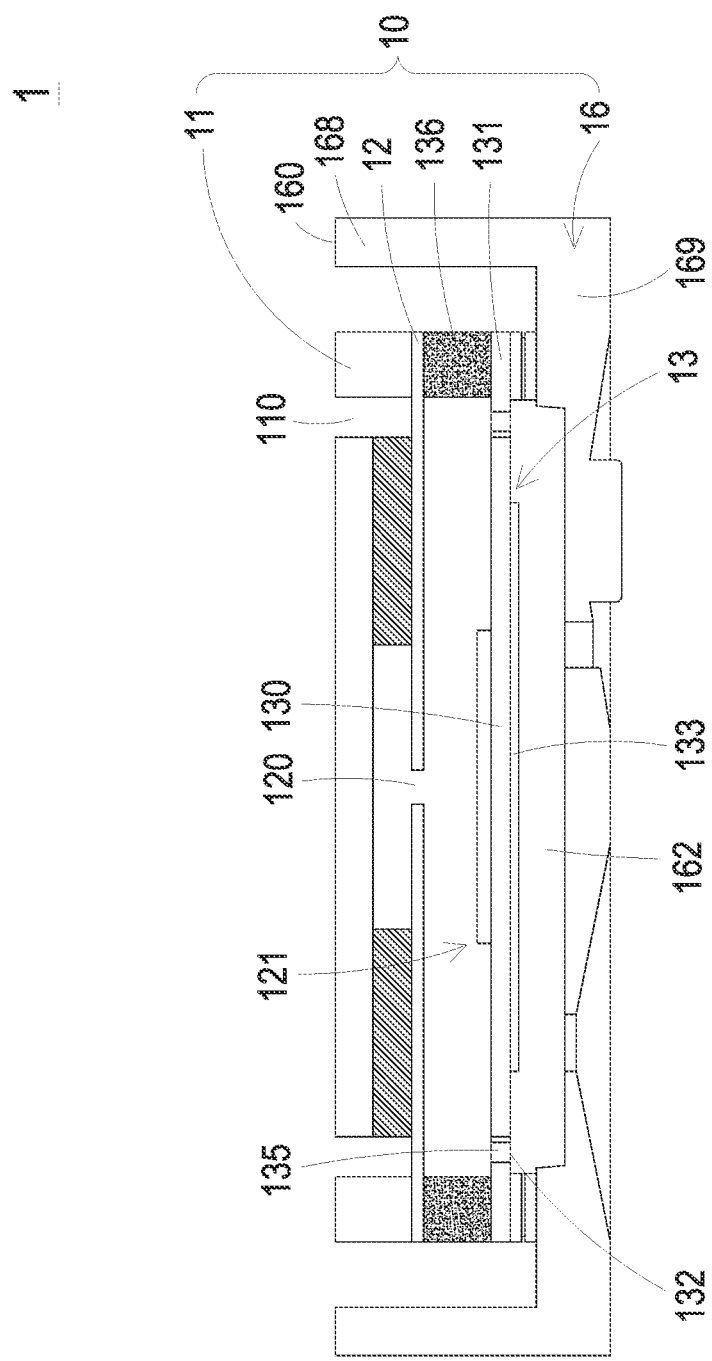
FIG. 1D is a schematic cross-sectional view illustrating the air motor of FIG. 1A.
Figure 2A:
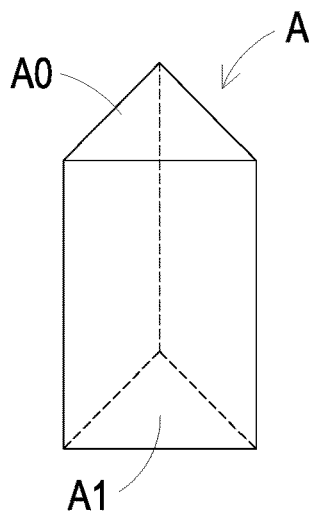
FIGS. 2A to 2E schematically illustrate some examples of the main body of the air motor according to the embodiment of the present invention, in which the unit structure has the shape of a polygonal prism.
Figure 2B:
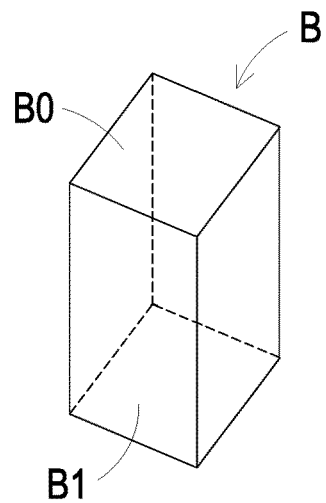
Figure 2C:
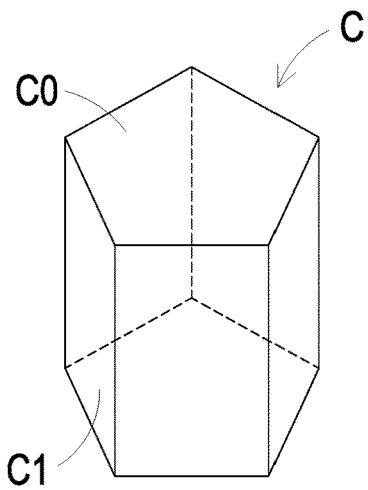
Figure 2D:
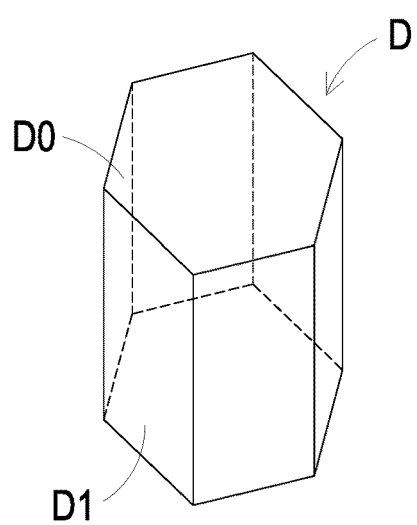
Figure 2E:
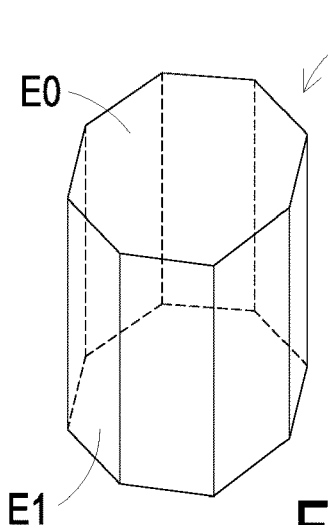

FIG. 1D is a schematic cross-sectional view illustrating the air motor of FIG. 1A. Please refer to FIGS. 1A, 1B and 1D. After the gas inlet plate 11, the resonance plate 12, the piezoelectric actuator 13, the first insulation plate 141, the conducting plate 15, the second insulation plate 142 and the gas collecting plate 16 are stacked on each other sequentially, the air motor 1 is assembled. The outer appearance of the air motor 1 is shown in FIG. 1A while the inner structure of the air motor 1 is shown in FIG. 1D. As shown in FIG. 1D, there is a gap between the resonance plate 12 and the piezoelectric actuator 13. In this embodiment, the gap is formed by an adhesive layer 136. The gap creates a first chamber 121 between the resonance plate 12 and the piezoelectric actuator 13 for temporarily storing the gas. Meanwhile, a gas-collecting chamber 162 is arranged between the piezoelectric actuator 13 and the gas collecting plate 16, which is in communication with the first chamber 121 through the vacant space 135 of the piezoelectric actuator 13. When the piezoelectric actuator 13 is enabled, the ambient external air is introduced into the air motor 1 through the at least one inlet 110 of the gas inlet plate 11. Then, the air is transferred to the first chamber 121 through the central aperture 120 of the resonance plate 12, and downwardly transferred to the gas-collecting chamber 162.

FIGS. 2A to 2E schematically illustrate examples of the main body of the air motor according to some embodiments of the present invention, in which the unit structure has the shape of a polygonal prism. The main body 10 of the air motor 1 comprises at least one unit structure, and the unit structure may be a polygonal prism and a cylinder. According to the first embodiment shown in FIGS. 1A to 1D, the unit structure is a square prism, but the unit structure may be the other types of polygonal prism, which includes but not limited to the examples shown in FIGS. 2A to 2E those exemplify the unit structures A, B, C, D and E in the shape of a triangular prism, a tetragonal prism, a pentagonal prism, a hexagonal prism, and an irregular polygonal prism, respectively. Each of the unit structures A to E has a top surface A0, B0, C0, D0, E0 and a bottom surface A1, B1, C1, D1, E1, while all cross sections between the top surface A0, B0, C0, D0, E0 and the bottom surface A1, B1, C1, D1, E1 have identical shapes. The top surface A0, B0, C0, D0, E0, the bottom surface A1, B1, C1, D1, E1 and the cross sections are parallel to each others. For example, the unit structure E has a top surface E0 and a bottom surface E0, and all cross sections between the top surface E1 and the bottom surface E0 are identical.

It is noted that numerous modifications and alterations of the polygonal prism may be made while retaining the teachings of the invention. For example, the triangular prism may be a regular triangular prism, an obtuse triangular prism or an acute triangular prism. For example, the tetragonal prism may include a square prism, a rectangular prism or a rhombic prism. The number of sides of the polygonal prism is not restricted. For example, a dodecagonal prism is feasible.

Figure 3A:
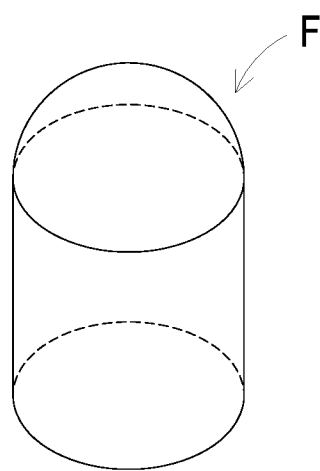
FIGS. 3A and 3B schematically illustrate some examples of the main body of the air motor according to the embodiment of the present invention, in which the unit structure has the shape of a cylinder.
Figure 3B:
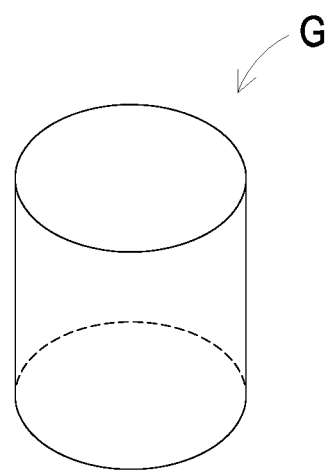

FIGS. 3A and 3B schematically illustrate some examples of the main body of the air motor according to some embodiments of the present invention, in which the unit structure has the shape of a cylinder. In the example as shown in FIG. 3A, the unit structure F of the main body is a circular cylinder with a hemispherical end. In the example as shown in FIG. 3B, the unit structure G of the main body is an elliptic cylinder. The cylinder may also be an irregular cylinder.

Figure 4A:
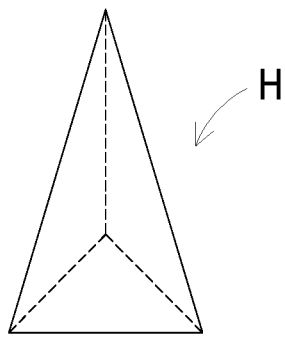
FIG. 4A to 4C schematically illustrate some examples of the main body of the air motor according to the embodiment of the present invention, in which the unit structure has the shape of a polygonal pyramid.
Figure 4B:
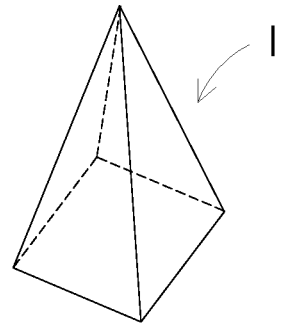
Figure 4C:
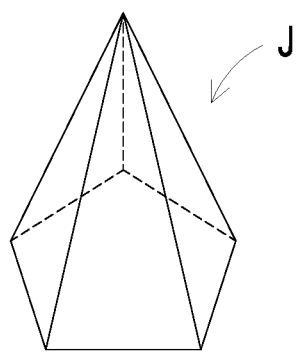
Figure 5:
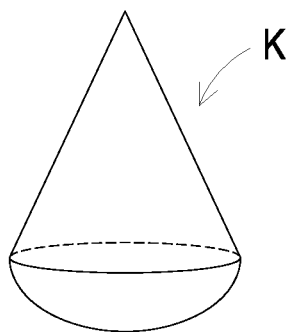
FIG. 5 schematically illustrates a variant example of FIG. 4.

Please refer to FIGS. 4A to 4C and FIG. 5. FIGS. 4A to 4C schematically illustrate some examples of the main body of the air motor according to some embodiments of the present invention, in which the unit structure has the shape of a polygonal pyramid. FIG. 5 schematically illustrates an example of the main body of the air motor according to one embodiment of the present invention, in which the unit structure has the shape of a cone. In the example as shown in FIG. 4A, the unit structure H of the main body is a triangular pyramid. In the example as shown in FIG. 4B, the unit structure I of the main body is a tetragonal pyramid. In the example as shown in FIG. 4C, the unit structure J of the main body is a pentagonal pyramid. The polygonal pyramid has a polygonal base and an apex, wherein the sizes of the surface areas of the polygonal base and the apex are different. Moreover, the unit structure may be a cone, more particular to a circular cone with a hemispherical end (see the unit structure K in FIG. 5). The unit structure may otherwise be an elliptic cone or an irregular cone.

It is noted that numerous modifications and alterations of the polygonal prism may be made while retaining the teachings of the invention. For example, the triangular pyramid is a regular triangular pyramid, an obtuse triangular pyramid or an acute triangular pyramid. For example, the tetragonal pyramid includes a square pyramid, a rectangular pyramid or a rhombic prism. The number of sides of the polygonal prism is not restricted. For example, an octagonal pyramid or a dodecagonal pyramid is feasible. Moreover, the polygonal pyramid includes the regular polygonal pyramid or the irregular polygonal pyramid.

As mentioned above, the appearance of the main body of the air motor is designed according to the practical requirements of applied instrument or device. However, the inner structure of the main body is similar to that of the first embodiment. Moreover, the profiles of the components in the main body may be varied according to the appearance of the main body as long as the structure, location, operation and function of the air motor are not influenced by the appearance of the main body.

Figure 6A:
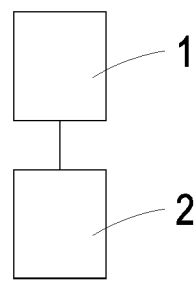
FIGS. 6A to 6C schematically illustrate the concepts of connecting plural air motors according to a second embodiment of the present invention.
Figure 6B:
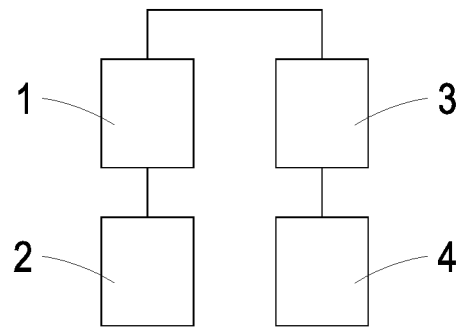
Figure 6C:
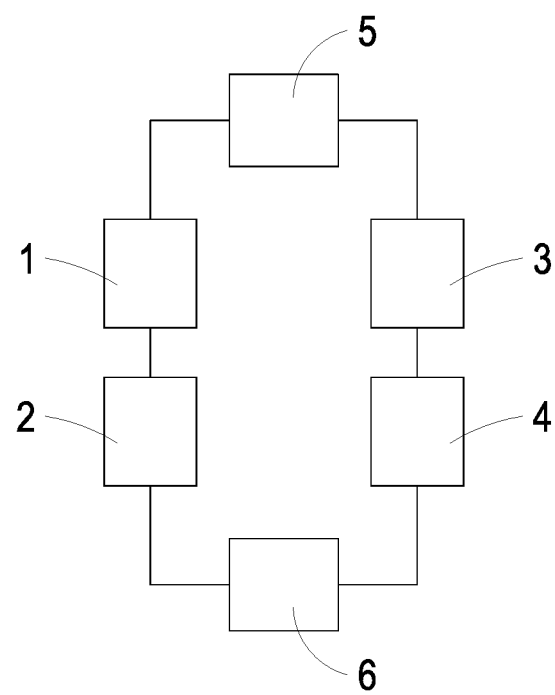

FIGS. 6A to 6C schematically illustrate the concepts of connecting plural air motors to assemble a combination structure according to some other embodiments of the present invention. As mentioned above, the main body of the air motor has a unit structure. As so, plural air motors can combine together by connecting the unit structures thereof. More specifically, the unit structures of the air motors can be connected to each other in series, in parallel or in series/parallel or stacked on each other, such that a combination structure is formed. In the example as shown in FIG. 6A, the unit structures of the air motor 1 and the air motor 2 are connected with each other in series. In the example as shown in FIG. 6B, the unit structures of the air motor 1 and the air motor 2 are connected with each other in series; similarly, the unit structures of the air motor 3 and the air motor 4 are connected with each other in series. Moreover, the serially-connected unit structures of the air motor 1 and the air motor 2, and the serially-connected unit structures of the air motor 3 and the air motor 4, are connected with each other in parallel. In other words, the combination structure is the serially-connected and parallel-connected structure. In the example as shown in FIG. 6C, the unit structures of the air motors 1, 2, 3, 4, 5 and 6, are connected with each other in series to define a loop-type combination structure.

Furthermore, the combination structure as an assembly structure, comprising the plural unit structures connected to each other, can have the unit structures in a specified arrangement. The specified arrangement includes but not limited to a linear arrangement, an array arrangement, a triangular arrangement, a ring-shaped arrangement, or a honeycomb arrangement. Regarding a combination structure, the amount of the air motors and the way they connect affect its output air pressure and the airflow rate of its output air flow.

As mentioned above, the air motor of the present invention comprises a main body the appearance of which can be varied according to the practical requirements, such that plural air motors can be assembled to form a combination structure in different types that outputs an air flow in desired air pressure and at desired airflow rate. Since the combination structure provides a certain degree of driving power and has various assembling types, the combination structure can replace various types of traditional motors, compressors or engines, and is suitably applied to various instruments or devices in pharmaceutical industries, electronic industries, printing industries, energy industries or traditional industries.

To conclude, the present invention provides an air motor which can be applied to various instruments or devices in pharmaceutical industries, electronic industries, printing industries, energy industries or traditional industries. The air motor is capable of converting electrical energy into kinetic energy and using the kinetic energy to generate a specified air pressure and an air flow at a specified airflow rate. The air motor comprises a main body and a piezoelectric actuator disposed within the main body. The appearance of the main body can be designed according to the practical requirements. When the piezoelectric actuator is enabled, the air within the main body is controlled and driven to flow, consequently producing the specified air pressure and the air flow at the specified airflow rate. Moreover, the unit structures of plural air motors may connect to each other in a specified arrangement by which the plural air motors assemble a combination structure, and the plural air motors of the combination structure collectively provide increased diving power. Meanwhile, the volume of the combination structure is adjustable to fit diverse requirements. In addition, comparing conventional motors, the noise of the air motor is reduced, and the applications of the air motor are expanded.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An air motor for converting electrical energy into kinetic energy and using the kinetic energy to generate a specified air pressure and an air flow at a specified airflow rate, the air motor comprising:
    a main body comprising at least one unit structure; and
    a piezoelectric actuator disposed within the main body and comprising:
        a suspension plate, wherein the suspension plate is a square plate and has a length in a range between 0.6 mm and 1 m, a width in a range between 0.6 mm and 1 m, and a thickness in a range between 0.1 nm and 1 m,
        an outer frame having at least one bracket connected to the suspension plate; and
        a piezoelectric plate attached on a first surface of the suspension plate, wherein the piezoelectric plate is a square plate and does not extend over the suspension plate, wherein the piezoelectric plate has a length in a range between 0.6 mm and 1 m, a width in a range between 0.6 mm and 1 m, and a thickness in a range between 0.1 nm and 50 mm,
    wherein the first surface of the suspension plate, a first surface of the outer frame and a first surface of the at least one bracket are coplanar with each other, and a second surface of the suspension plate, a second surface of the outer frame and a second surface of the at least one bracket are coplanar with each other,
    wherein the specified air pressure is in a range between 10 mmHg and 10000 mmHg, and the specified airflow rate is in a range between 0.1 liter/min and 1000 liter/min, and
    wherein when the piezoelectric actuator is enabled, air within the main body is controlled and driven to flow, wherein the air motor is applicable to replace various types of motors, compressors or engines,
    wherein the main body is a combination of a gas inlet plate and a gas collecting plate, wherein the gas collecting plate comprises a bottom plate and a sidewall protruding from the edges of the bottom plate, and an accommodation space is defined by the bottom plate and the sidewall collaboratively, wherein the piezoelectric actuator and the gas inlet plate are disposed within the accommodation space.

2. The air motor according to claim 1, wherein the at least one unit structure is a polygonal prism or a cylinder.

3. The air motor according to claim 2, wherein the at least one unit structure is the polygonal prism.

4. The air motor according to claim 2, wherein the polygonal prism is a triangular prism, a square prism, a rectangular prism, a rhombic prism, a pentagonal prism, a hexagonal prism, an octagonal prism, a dodecagonal prism or an irregular polygonal prism.

5. The air motor according to claim 4, wherein the triangular prism is a regular triangular prism, an obtuse triangular prism or an acute triangular prism.

6. The air motor according to claim 2, wherein the cylinder is a circular cylinder with a hemispherical end, an elliptic cylinder or an irregular cylinder.

7. The air motor according to claim 1, wherein the at least one unit structure is a polygonal pyramid or a cone.

8. The air motor according to claim 7, wherein the at least one unit structure is the polygonal pyramid having a base and an apex, and the sizes of the surface areas of the base and the apex are different.

9. The air motor according to claim 7, wherein the polygonal pyramid is a triangular pyramid, a square pyramid, a rectangular pyramid, a rhombic pyramid, a pentagonal pyramid, a hexagonal pyramid, an octagonal pyramid, a dodecagonal pyramid or an irregular polygonal pyramid.

10. The air motor according to claim 9, wherein the triangular pyramid is a regular triangular pyramid, an obtuse triangular pyramid or an acute triangular pyramid.

11. The air motor according to claim 7, wherein the cone is a circular cone with a hemispherical end, an elliptic cone or an irregular cone.

12. The air motor according to claim 1, wherein the at least one unit structure and adjacent unit structures are connected with each other in series, in parallel or in series/parallel or stacked on each other so as to form a combination structure affecting the air pressure and the airflow rate.

13. The air motor according to claim 12, wherein the combination structure is an assembly structure comprising the at least one unit structure and the adjacent unit structures connected to each other in a specified arrangement, wherein the specified arrangement includes one of a linear arrangement, an array arrangement and a ring-shaped arrangement.

14. The air motor according to claim 1, wherein the length of the suspension plate is in a range between 2 cm and 20 cm, the width of the suspension plate is in a range between 2 cm and 20 cm, and the thickness of the suspension plate is in a range between 2 cm and 20 cm.

15. The air motor according to claim 1, wherein the air motor further comprises a resonance plate, wherein the gas inlet plate, the resonance plate, the piezoelectric actuator and the gas collecting plate are stacked on each other sequentially, a gap is formed between the resonance plate and the piezoelectric actuator to define a first chamber, and a gas-collecting chamber is formed between the piezoelectric actuator and the gas collecting plate, wherein when the piezoelectric actuator is enabled, air is fed into the gas inlet plate, transferred through the resonance plate to the first chamber, and downwardly transferred to the gas-collecting chamber.

\* \* \* \* \*